United States Patent
Drechsler et al.

(10) Patent No.: US 8,897,846 B2
(45) Date of Patent: Nov. 25, 2014

(54) PROCESS FOR PRODUCING A CONNECTING STRUCTURE BETWEEN TWO SUPERCONDUCTORS AND STRUCTURE FOR CONNECTING TWO SUPERCONDUCTORS

(75) Inventors: Antje Drechsler, Bretten (DE); Wilfried Goldacker, Heidelberg (DE); Marijn Pieter Oomen, Erlangen (DE); Jacob Johan Rabbers, Baiersdorf (DE); Sonja Schlachter, Stutensee (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/499,372

(22) PCT Filed: Sep. 29, 2010

(86) PCT No.: PCT/EP2010/064415
§ 371 (c)(1),
(2), (4) Date: Mar. 30, 2012

(87) PCT Pub. No.: WO2011/039223
PCT Pub. Date: Apr. 7, 2011

(65) Prior Publication Data
US 2012/0184446 A1 Jul. 19, 2012

(30) Foreign Application Priority Data
Sep. 30, 2009 (DE) .......................... 10 2009 043 580

(51) Int. Cl.
*H01L 39/24* (2006.01)
*H01R 4/68* (2006.01)

(52) U.S. Cl.
CPC .............. *H01R 4/68* (2013.01); *H01L 39/2487* (2013.01)

USPC .................. 505/220; 501/96.1; 501/96.3

(58) Field of Classification Search
USPC ................... 505/220; 501/96.1, 96.3
See application file for complete search history.

(56) References Cited

U.S. PATENT DOCUMENTS 4,631,808 A * 12/1986 Jones ............................ 29/599
6,921,865 B2    7/2005 Morita et al.
(Continued)

FOREIGN PATENT DOCUMENTS

DE          3413167        10/1985
DE         10211186         2/2003
(Continued)

OTHER PUBLICATIONS

X. H. Li et al., "High critical current joint of $MgB_2$ tapes using Mg and B powder mixture as flux," Superconductor Science and Technology, vol. 21, 2008, 5 pages.

(Continued)

*Primary Examiner* — Paul Wartalowicz
(74) *Attorney, Agent, or Firm* — Staas & Halsey LLP

(57) ABSTRACT

A process produces a connecting structure between two superconductors, in particular magnesium diboride superconductors embodied as a superconducting core wire surrounded by normally conducting metal. A substance which reduces the melting point of magnesium is admixed to a substance mixture including magnesium and boron, and the exposed ends of the core wires are brought into contact with the substance mixture, which is caused to react in situ at a reaction temperature corresponding to the lower melting point to give magnesium diboride.

18 Claims, 1 Drawing Sheet

(56) References Cited

U.S. PATENT DOCUMENTS

| | | |
|---|---|---|
| 2003/0173103 A1 | 9/2003 | Morita et al. |
| 2004/0204321 A1 | 10/2004 | Gumbel et al. |
| 2005/0090403 A1* | 4/2005 | Raber et al. ............ 505/100 |
| 2008/0236869 A1 | 10/2008 | Marte et al. |
| 2009/0005251 A1* | 1/2009 | Fluekiger et al. ........ 505/231 |
| 2009/0101325 A1* | 4/2009 | Belton et al. ............ 165/185 |
| 2009/0105079 A1 | 4/2009 | Leghissa |
| 2011/0111962 A1* | 5/2011 | Wang et al. ............. 505/122 |

FOREIGN PATENT DOCUMENTS

| | | | | |
|---|---|---|---|---|
| DE | 60212768 | | 6/2007 | |
| DE | 102006020829 | | 11/2007 | |
| DE | 10 2009 043 580.8 | | 9/2009 | |
| EP | 1609757 | | 12/2005 | |
| JP | 2002-260463 | | 9/2002 | |
| JP | 2003-22719 | | 1/2003 | |
| JP | 2003-86265 | | 3/2003 | |
| JP | 2008-91325 | | 4/2008 | |
| WO | WO 2009/012513 | * | 1/2009 | .......... H01L 39/12 |
| WO | PCT/EP2010/064415 | | 9/2010 | |
| WO | 2010/136263 A1 | | 12/2010 | |

OTHER PUBLICATIONS

International Search Report for PCT/EP2010/064415, mailed on Dec. 29, 2010.
Canadian Office Action for related Canadian Patent Application No. 2,775,830, issued Aug. 27, 2013, 4 pages.
Japanese Office Action mailed Nov. 12, 2013 in corresponding Japanese Application No. 2012-531389.
German Translation of Chinese Office Action mailed Feb. 28, 2014 in corresponding Chinese Application No. 201080043899.5.
Japanese Notice of Allowance mailed Mar. 4, 2014 in corresponding Japanese Application No. 2012-531389.

* cited by examiner

PROCESS FOR PRODUCING A CONNECTING STRUCTURE BETWEEN TWO SUPERCONDUCTORS AND STRUCTURE FOR CONNECTING TWO SUPERCONDUCTORS

CROSS REFERENCE TO RELATED APPLICATIONS

This application is based on and hereby claims priority to International Application No. PCT/EP2010/064415 filed on Sep. 29, 2010 and German Application No. 10 2009 043 580.8 filed on Sep. 30, 2009, the contents of which are hereby incorporated by reference.

BACKGROUND

The invention relates to a method for producing a connecting structure between two superconductors, in particular magnesium diboride superconductors, which comprise a superconducting core wire enclosed by normally conducting metal, and to a structure for connecting two superconductors, in particular two magnesium diboride superconductors, which comprise a superconducting core wire enclosed by normally conducting metal.

The use of superconductors allows energy-saving and particularly stable operation of magnets, for example magnetic resonance magnets, having short-circuited superconducting leads (so-called persistent mode). In this case, the energized superconducting magnet is short-circuited through a superconductor. The short-circuited magnet then forms its own current loop, in which the current can flow essentially without resistance. In this persistent mode, the current source can be disconnected from the magnet, so that energy-saving operation is possible. The advantage of persistent mode operation is an extremely high stability of the magnetic field, which cannot be achieved in this way even with the best current sources.

The short circuit is achieved by using a short-circuit switch, the so-called persistent switch. For this purpose, the conductor ends of the magnet coil are connected by a superconducting wire which can be brought into normal conduction by heating and then has a comparatively high resistance. When the persistent switch is in the normally conducting state, the current then flows from the current source through the superconducting coil which can be energized or de-energized in this state. Once the magnet has reached the desired field strength, it can be switched over into the persistent mode. To this end, the persistent switch is cooled and becomes superconductive, so that the magnet and the superconducting wire again form their own current loop.

What are essential for maximally long and stable operation of persistent mode are the resistance and inductance of the resulting current loop. The resistance of the contacts or connection points, by which the persistent switch is connected to the wire ends of the magnet, usually via a connecting structure, is in this case essential, so that one prerequisite for stable persistent mode operation is the possibility of producing a superconducting connection of the superconductor ends.

In other applications as well, it is often necessary to connect two or more superconductors with the lowest possible resistance. For example, magnet systems are known which comprise a plurality of individually wound coils, in particular 4 or 8 coils, which are to be connected via such contacts.

In the recent past, it has already been possible to show that superconducting connections can be produced in particular between magnesium diboride wires ($MgB_2$ wires). The superconducting connecting structure may in this case be produced on the basis of magnesium diboride or on the basis of other superconductors, for example NbTi. The superconducting connecting structure should have a current-carrying capacity which is as high as possible, in order not to become the limiting element for current operation. In particular, the contact surfaces between the wire ends and the connecting structure must have a high connectivity and therefore be transmissive for high super-currents.

In order to produce such connecting structures, it has been proposed for example in U.S. Pat. No. 6,921,865 B2, in order to connect two superconductors, to arrange a magnesium diboride powder between the superconductors. Specifically, it is proposed to compress the already reacted magnesium diboride with a high pressure, in order to improve the bonding properties. It is also known additionally to sinter the magnesium diboride powder. These so-called ex-situ methods, however, disadvantageously generate only point contacts between the individual grains, the sintering additionally degrading the superconductor wire.

Recently, therefore, in an article by X. H. Lee et al., "High critical current joint of $MgB_2$ tapes using Mg and B powder mixture as flux", Supercond. Sci. Technol. 21 (2008) 025017, it has been proposed to use an in-situ method in which a magnesium and boron powder mixture is used, which is only reacted to magnesium diboride in situ by heating in a protective atmosphere.

Good results have been achieved in this case, but not for the range actually relevant e.g. in magnetic resonance devices, in which magnetic fields that are greater than 0.5 T or temperatures above 10 K occur. A possible reason for this is that the contact area is not sufficient. Furthermore, wire degradation takes place because of the prior mechanical processing of the wire ends and, in particular, also owing to the heat treatment during the in-situ reaction. There is probably a rather poor connection on the contact surface. Further problems which may arise are the inhomogeneous diffusion of copper or other elements in from the superconductor wire, so that the properties of the magnesium diboride in the contact are impaired, as well as other reasons.

SUMMARY

It is therefore one possible object to provide a connecting structure between two superconductors and a method for its production, the connecting structure still having a sufficiently high current-carrying capacity even in magnetic fields greater than 0.5 T and at temperatures above 10 K and the contact between the superconductors and the connecting structure lying between them being significantly improved.

In order to achieve this object, the inventors propose a method in which a substance which lowers the melting temperature of magnesium is admixed to a material mixture of magnesium and boron and the exposed ends of the core wires are brought in contact with the material mixture, which is made to react with magnesium diboride in situ at a reaction temperature corresponding to the lower melting temperature.

It is thus proposed to use a substance which lowers the melting temperature of magnesium. In this case, a metal, in particular copper and/or silver, may preferably be used as the substance, copper being particularly preferred. In another configuration, the substance may be mixed in at from 1 to 20 wt %, in particular 10 wt %.

The melting temperature of magnesium, which is normally 650° C., being a measure of the temperatures at which the reaction to form magnesium diboride begins in the furnace, is accordingly lowered as known per se by the substance which lowers the melting temperature of magnesium, so that the reaction can take place in situ at a lower temperature compared with the related art. In this way, the temperature at which the reaction occurs can be lowered, for example, by 20-30° C. The superconductor wire, in particular the core wire, can thereby be subjected to less detrimental effects and the degradation due to heat treatment is reduced, which leads to better contact.

Although it is known that such substances, in particular copper and/or silver, normally impair the properties of the resulting superconductor somewhat, in tests for the proposed method and device it has surprisingly been found that a significantly better contact is formed, particularly in the region of the wire ends of the superconductors, the resistance of which is reduced and the current-carrying capacity of which is increased in comparison with conventional methods. In particular, in contrast to the connecting structures known in the related art, the resulting connecting structure is even suitable for being used under the conventionally required conditions, i.e. in magnetic fields greater than 0.5 T and temperatures above 10 K, and for delivering outstanding properties. Particularly in the case of the magnetic resonance devices, a significantly improved solution is therefore provided. All this is achieved by adding the substance which lowers the melting temperature of magnesium, which not only exhibits advantages by lowering the treatment temperature but also improves the formation of magnesium diboride from magnesium and boron by reaction in the connecting structure. The method is suitable, in particular, for use in a magnet manufacturing process, for example to form a persistent switch.

It is of course particularly advantageous for the material mixture to form a homogeneous bulk, so that the reaction temperature is reduced throughout and optimal properties can therefore be achieved at a particular temperature. Particularly advantageously, a mechanically alloyed powder may in this case be used as the material mixture. The process of mechanical alloying (MA) is known per se and may of course already be used when admixing the substance. The various materials—i.e. in this case particularly magnesium, boron and the substance that lowers the melting temperature of magnesium—are mixed by a ball mill operated at high speed, in particular with planetary gearing, during the mechanical alloying. Larger grains are thereby broken up and, in particular, a partial reaction already takes place, which will be discussed in more detail below. An extremely homogeneous material mixture can thus be obtained, in which the reaction temperature is uniformly lowered throughout.

In another expedient configuration, at least one further additive may be added to the material mixture. In this way, the properties of the connecting structure can be improved further. An additive which improves the pinning and/or increases the current-carrying capacity and/or increases the critical field and/or retards the lowering of the critical temperature and/or binds oxygen may be used as the additive. In this case, a metal and/or a compound containing carbon and/or carbon and/or a boride may be used as the additive, silicon carbide (SiC) and/or calcium hexaboride ($CaB_6$) being particularly suitable. Silicon carbide, especially nano-silicon carbide, has proven to be an outstanding additive for magnesium diboride. In this way, the current-carrying capacity can be increased and the critical temperature raised, and it has furthermore been found that only a relatively slow lowering of the critical temperature takes place in sizeable fields. Other additives may, however, also be envisaged here, for example metals or carbon. It is also expedient to use an additive which binds oxygen, in particular $CaB_6$. In this way, for example, it is possible to avoid the formation of a magnesium oxide layer which impairs the contact. By the use of further additives, it is in particular possible to compensate for a disadvantageous aspect of the substance that lowers the melting temperature of magnesium, although it should be a gain again be emphasized that the advantages predominate even without use of an extra additive, and lead to an improved connecting structure.

In another advantageous configuration, a material mixture additionally comprising magnesium diboride particles may be used. Thus, there are then already reacted magnesium diboride components in the material mixture. In this context, it should be pointed out that such an effect may for example already be achievable during the mechanical alloying, as explained above. It can be shown that owing to the presence of already reacted magnesium diboride, the entry of normally conducting metal which surrounds the superconducting core wire into the contact material can be restricted, as can the loss of magnesium which enters the normally conducting metal. It should be pointed out that this magnesium loss effect may additionally or alternatively also be compensated for by deviating from the 1:2 mixing ratio for magnesium and boron with an increased magnesium component, for example by rate using a ratio of 1.15:2 or the like. In any event, however, the presence of already reacted magnesium diboride in the material mixture will reduce the entry of further normally conducting metal which otherwise would detrimentally affect the properties of the connecting structure.

Particular attention in the production of such connecting structures must also be paid to the mechanical processing of the superconductors, in particular the exposure of the contact surfaces on the ends of the core wires, so that the least possible or only minor degradation occurs with the largest possible contact area. In this case, the ends of the core wires may be exposed by grinding. For example, the grinding tool may be gradually changed from coarse to fine tools. In this case, a grinding material should be used which as far as possible leaves no residues on the ground end. The grinding process may preferably be carried out slowly, in order to avoid development of heat.

A further improvement in terms of the processing of the superconductors themselves is obtained if the superconductors are fixed in position when the ends of their core wires are being exposed, particularly in at least a part of a "joint cup" in which the subsequent reaction of the magnesium and the boron to form magnesium diboride takes place. By the described fixing, it is possible in particular to keep the wire ends unmoved and even compressed during large parts of the process for producing the connecting structure, so that for example cracking can be avoided. Often, in connecting structures such as the connecting structure according to the proposals, a joint cup is provided which may, for example, be formed of metals or a metal alloy and at a particular time during the method is filled with the material mixture so that the latter can react in it. To this end, for example, the joint cup is closed by a screwable cap in such a way that the material mixture contained in it is already significantly compressed, so that air pockets and inhomogeneities are avoided as far as possible. According to the proposals, the superconductors may thus already be fixed in this joint cup in order to expose the ends of the core wires, i.e. the contact surfaces. The ends are thus prepared in situ, consequently no longer have to be moved and can, in particular, be kept substantially compressed and immobile. The mechanical load on the superconductor, in particular the relevant end of the core wire, is in this case minimized so that degradation can be avoided.

In order to increase the contact area, the contact surface on the ends of the core wires may be exposed at an angle to the cross-sectional plane of the core wires. In this way, a larger contact area can be produced, so that it is possible to achieve a better contact, a lower resistance and a greater current-carrying capacity.

As already mentioned, the material mixture may be introduced into a joint cup into which the ends of the core wires extend, and in which the material mixture is compressed before the reaction. Then, in a particularly advantageous configuration, before the ends of their core wires are exposed in a wall of the joint cup, the superconductors may be introduced into this wall, obliquely thereto, and fixed there. In this way, particularly during the grinding, a large contact area is created and the mechanical load on the wires is reduced.

Preferably, for the reaction, the superconductors' ends to be connected may be introduced, with the material mixture arranged between them, particularly in a joint cup, into a furnace in which there is a protective gas atmosphere, in particular under positive pressure. In this way it is not necessary for superconductor ends which are to be connected and which are of course connected to the magnet that is in particular cumbersome and unwieldy, to be introduced into the furnace in such a way that a fully air-tight seal is possible. This is because if the protective gas is under positive pressure, then in fact it flows continuously out of the furnace past the superconductor wire ends so that no air, which entails the risk of the highly reactive magnesium reacting, can enter the furnace. The reaction therefore takes place entirely in the protective gas atmosphere without a vacuum-tight furnace being required.

Besides the proposed method, the inventors also propose a structure for connecting two superconductors, in particular two magnesium diboride superconductors, which comprise a superconducting core wire enclosed by normally conducting metal, which structure is produced by the method. The corresponding ends of the superconductors are therefore connected by an in-situ reaction of a material mixture which, besides magnesium and boron, also contains a substance that lowers the melting temperature of magnesium, so that the reaction can take place at a lower temperature. In this way, better contact is achieved with a higher current-carrying capacity, since both the reactivity is improved and the wire degradation due to the heat treatment is reduced.

Of course, all the configurations indicated in relation to the proposed method may be applied similarly to the proposed connecting structure, so that the latter may for example also comprise a joint cup into which the connected superconductor wire ends penetrate, for example obliquely. Further additives may likewise be provided, in particular silicon carbide and/or calcium hexaboride. In this case, as the substance for lowering the melting temperature of magnesium, it is preferable to use copper which is consequently contained in the reacted material mixture that connects the exposed ends of the core wires.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
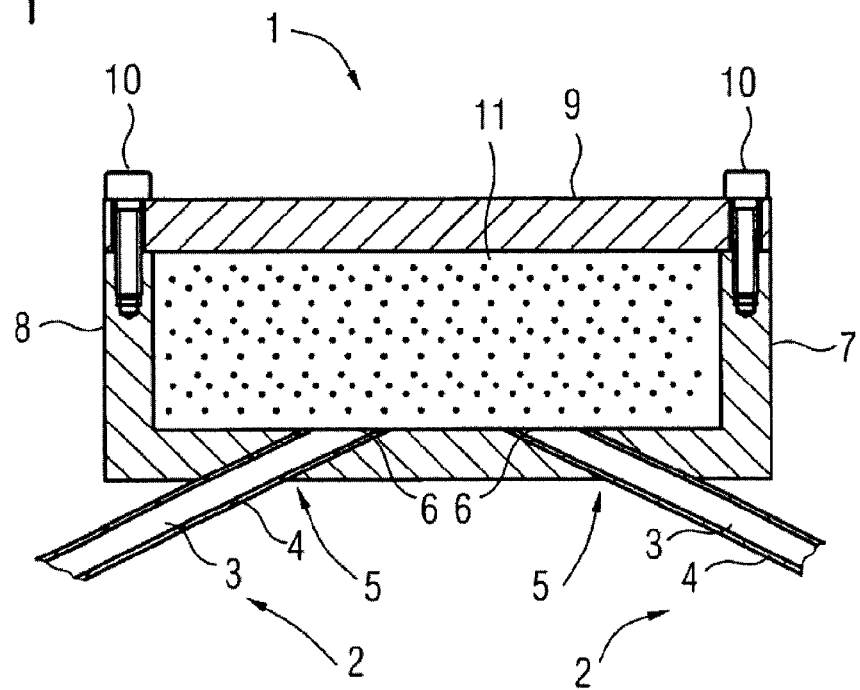
FIG. 1 shows a connecting structure according to one embodiment on the inventors' proposals.

Reference will now be made in detail to the preferred embodiments of the present invention, examples of which are illustrated in the accompanying drawings, wherein like reference numerals refer to like elements throughout.

FIG. 1 shows an outline diagram of the connecting structure 1 which is used to connect two superconductors 2, in the present case in order to form a persistent switch for the persistent mode of a magnet. The connecting structure is thus intended to be used in an environment in which fields greater than 0.5 T prevail and/or the temperature is more than 10 K.

The superconductors comprise a superconducting core wire 3, in the present case formed of magnesium diboride, which is enclosed by a cladding of a normally conducting metal 4. Of course, a plurality of core wires (filaments) may also be provided.

It should already mentioned at this point that the diagram in the figure merely represents an outline diagram which may be modified in respect of the arrangement of the superconductors 2 etc. For example, it is conceivable to arrange the ends 5 next to one another in order to minimize the distance between the contact surfaces 6. It is shown that the ends 5 are fixed obliquely in a joint cup 7, so that the contact surfaces 6 are exposed to the interior of the joint cup 7. Owing to the oblique positioning of the conductors 2, they are also formed with a size larger than the actual cross section of the core wire 3.

The joint cup 7, which may moreover be formed of steel, comprises a lower cup part 8 and a cap 9, which can be fastened with screws 10 in order to form the joint cup 7 so that a material mixture 11 arranged in the joint cup 7 can be compressed before the reaction, as will be discussed in more detail below with reference to the production method. Besides steel, the joint cup may also be formed of another metal which has a higher thermal expansion coefficient than $MgB_2$. Cooling to the working temperature therefore leads to compression of the material mixture and thus the necessary mechanical stability. In the finished connecting structure 1 represented here, the material mixture 11 exists as a reacted material mixture 11, which means that magnesium diboride forms the corresponding conductive connection between the contact surfaces 6.

The connecting structure 1 has the particularly advantageous properties already discussed above, especially in respect of the current-carrying capacity and the contact quality since, for production, a material mixture 11 has been used which comprises a substance that lowers the melting temperature of magnesium.

In order to produce the proposed connecting structure 1, the ends 5 are first prepared, preferably under a protective atmosphere. For this, the ends 5 are first fixed in the lower cup part 8, after which, as shown, they are ground obliquely so that the enlarged contact area 6 is obtained. Throughout the grinding process, the superconductors 2 are already kept fixed in the lower cup part. The ends 5 are prepared by grinding, with development of heat being avoided and a transition being made from coarser grinding tools to finer grinding tools. Non-damaging preparation is thus possible.

Furthermore, the as yet unreacted material mixture 11 is prepared. This is done in the present case by mechanical alloying. Magnesium and boron, here in a ratio of 1.15:2, are mixed together with copper as the substance that lowers the melting temperature of magnesium, copper being provided at 10 wt %. The substances of the material mixture 11 are mixed by a ball mill with planetary gearing, which is operated at high speed. Initial magnesium diboride particles are in this case already formed by reaction, which then likewise form a part of the material mixture. It is, however, also conceivable to add magnesium diboride particles in another way.

In the present case, silicon carbide which improves the pinning properties, the critical field and further properties of this type, as well as calcium hexaboride which binds oxygen, are provided as further additives. These extra additives are likewise added to the material mixture 11.

After the contact surfaces 6 have already been prepared, the lower cup part 8 is then filled with the material mixture 11, where it is then compressed by applying the cap 9 and screwing it on.

The material mixture 11 prepared in this way in the joint cup 7 is then introduced into a furnace, in which there is a protective gas atmosphere under positive pressure. Protective gas therefore flows constantly past the emerging superconductors and prevents ingress of air. The material mixture 11 is reacted in the furnace, magnesium diboride being formed from magnesium and boron. This can take place at a lower temperature than usual, since the melting point of the magnesium has been lowered by adding copper, so that for example the material mixture can be left at about 620° C. in the furnace for 15 minutes. The heating and cooling processes can in this case take place slowly, in order to avoid degradation resulting therefrom.

This completes the production of the connecting structure 1.

Figure 2:
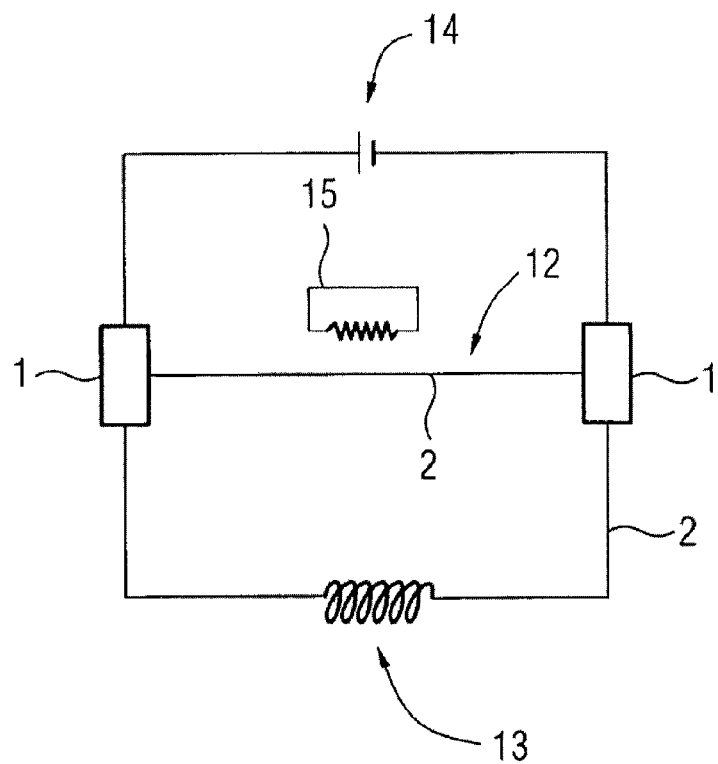
FIG. 2 shows the use of the connecting structure according to one embodiment of the inventor' proposals to form a persistent switch in a superconducting magnet.

FIG. 2 shows a possible use of the connecting structure 1 to form a persistent switch 12 for a superconducting magnet 13. Both the persistent switch 12 and the magnet 13 comprise magnesium diboride superconductors 2. They are connected by the connecting structure 1. The magnet 13 can initially be energized by a current source 14 so long as the superconductor 2 of the persistent switch 12 is normally conductive, which is achieved by a heating device 15. Once the persistent switch 12 has become superconductive again, a closed current loop is formed and operation in "persistent mode" is possible and the current source 14 can be deactivated.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A method for producing a connecting structure between two superconductors, comprising:
   providing magnesium diboride superconducting core wires, each enclosed within a normally conducting metal;
   forming exposed ends respectively on the superconducting core wires;
   mixing magnesium and boron with a substance that lowers a melting temperature of magnesium when mixed with magnesium, to produce a material mixture containing 1 to 20 wt % of the substance;
   bringing the exposed ends of the core wires into contact with the material mixture; and
   allowing the exposed ends of the core wires to react with the material mixture in situ at a reaction temperature corresponding to the lower melting temperature, to thereby form a magnesium diboride and a magnesium diboride connecting structure between the superconducting core wires.

2. The method as claimed in claim 1, wherein the material mixture contains at least one further additive.

3. The method as claimed in claim 2, wherein the at least one further additive improves pinning and/or increases a current-carrying capacity and/or increases a critical field and/or retards a lowering of a critical temperature and/or binds oxygen.

4. The method as claimed in claim 2, wherein the at least one further additive is selected from the group consisting of a metal, carbon, a compound containing carbon, and a boride.

5. The method as claimed in claim 3, wherein the at least one further additive is selected from the group consisting of SiC and $CaB_6$.

6. The method as claimed in claim 1, wherein
   the core wires are fixed in position to a joint cup when the exposed ends are formed respectively on the core wires.

7. The method as claimed in claim 6, wherein
   the material mixture is added to the joint cup, and
   the material mixture is reacted in the joint cup with the core wires fixed in position.

8. The method as claimed in claim 1, wherein the material mixture is introduced into a joint cup into which the exposed ends of the core wires extend.

9. The method as claimed in claim 8, wherein the material mixture is compressed in the joint cup.

10. The method as claimed in claim 8, wherein
    before the exposed ends are formed respectively on the core wires, the core wires are introduced through a wall of the joint cup, such that the core wires are obliquely fixed to the joint cup.

11. The method as claimed in claim 1, wherein
    the core wires are introduced into a container, with the material mixture arranged between the core wires,
    an in situ reaction is caused by placing the container and the core wires into a furnace, and
    the furnace contains a protective gas atmosphere.

12. The method as claimed in claim 11, wherein
    the container is a joint cup,
    the material mixture is retained under a positive pressure within the joint cup, and
    the protective gas atmosphere is an oxygen deficient gas atmosphere.

13. The method as claimed in claim 1, wherein the substance which produces a lower melting temperature is copper and/or silver.

14. The method as claimed in claim 1, wherein the material mixture is a mechanically alloyed powder.

15. The method as claimed in claim 1, wherein the material mixture contains magnesium diboride particles.

16. The method as claimed in claim 1, wherein the exposed ends are formed respectively on the core wires by grinding.

17. The method as claimed in claim 1, wherein each of the exposed ends is formed to produce a contact surface an angle to a cross-sectional plane of the respective core wire.

18. The method as claimed in claim 1, wherein in the mixing, magnesium that has not yet reacted with boron to form magnesium diboride is mechanically alloyed with boron.

* * * * *